United States Patent
Spehr et al.

[11] Patent Number: 5,808,309
[45] Date of Patent: Sep. 15, 1998

[54] APPARATUS FOR GENERATING AN ELECTRON BEAM

[75] Inventors: Rainer Spehr, Ober-Ramstadt; Michael Schmitt, Offenbach; Jürgen Frosien, Riemerling, all of Germany

[73] Assignee: ACT Advanced Circuit Testing Gesellschaft fur Testsystementwicklung mbH, Munich, Germany

[21] Appl. No.: 932,119

[22] Filed: Sep. 17, 1997

[30] Foreign Application Priority Data

Oct. 2, 1996 [DE] Germany .................... 96 115 830.0

[51] Int. Cl.⁶ .................................................... H01J 37/00
[52] U.S. Cl. ............................................................ 250/423 P
[58] Field of Search ........................ 250/423 P, 423 F, 250/423 R, 310

[56] References Cited

U.S. PATENT DOCUMENTS 4,868,380  9/1989  Booman et al. .
5,041,724  8/1991  Feuerbaum et al. .
5,289,004  2/1994  Okada et al. ..................... 250/423 F

FOREIGN PATENT DOCUMENTS 0 348 611 A2  1/1990  European Pat. Off. .
0 445 787 A1  9/1991  European Pat. Off. .

*Primary Examiner*—Kiet T. Nguyen
*Attorney, Agent, or Firm*—Reising, Ethington, Learman & McCulloch, PLLC

[57] ABSTRACT

The invention relates to apparatus for generating an electron beam with an optical waveguide, a light source which is coupled on one end of the optical waveguide, a coating for generated electrons which is applied to the other end of the optical waveguide as well as field-generating means in order to lower the electron work function of the coating so far that a photoemission current can be generated. According to the invention a metal carbide is used as the coating.

12 Claims, 4 Drawing Sheets

APPARATUS FOR GENERATING AN ELECTRON BEAM

The invention relates to an apparatus for generating an electron beam according to the preamble to claim 1 as well as an electron beam device according to the generic concept of claim 11.

From U.S. Pat. No. 5,041,724 there is known a method of operating an electron beam device which has a cathode which can be acted upon by a photon beam, an anode for accelerating the electrons released from the cathode in the direction of an optical axis, an objective lens and a detector for detecting the secondary particles released from a specimen. The cathode which is constructed as a tip is irradiated laterally with photons, the energy of which is lower than the electron work function of the cathode material and the work function is reduced with the aid of an external electrical field to such an extent that photoemission but no field emission occurs.

In another embodiment, instead of the external electrical field the cathode is heated to such an extent that photoemission but no thermal emission occurs.

However, the lateral focusing of the photons onto the cathode tip is relatively complicated.

Apparatus for generating an electron beam according to the preamble to claim 1 is known from U.S. Pat. No. 4,868,380. The photocathode described there is produced by a semiconductor coating of one end of the optical waveguide. The photons are fed at the other end.

Semiconductor materials do indeed have a substantially lower electron work function than other cathode coatings, such as gold and tungsten, but this coating of the cathode tip is relatively difficult to produce.

If for example vapour-deposited B-W-B, B-W or Cr emission layers are used instead of the semiconductor layer, the electron work functions of these layers are so high that the photoemission current produced by visible light in continuous mode is only a fraction of the field emission current, approximately 1/10 to ⅓.

The object of the invention, therefore, is to make further developments to the apparatus for generating an electron beam according to the preamble to claim 1 or, respectively, to the electron beam apparatus according to the generic concept of claim 11 in such a way that the ratio of photoemission current to field emission current is significantly improved, particularly when excited by visible light.

This object is achieved according to the invention by the characterising features of claims 1 and 11, by the use of a metal carbide as coating for one end of the optical waveguide. From the tests on which the invention is based it has been shown that metal carbide coatings have a comparatively low electron work function and as a result the supporting extraction field can be correspondingly reduced in strength. The metal carbide compound is further distinguished by a high hardness.

The combination of the coating with a metal carbide on one end of the optical waveguide and the feeding of the light with the aid of a laser diode is particularly advantageous. Laser diodes are distinguished over conventional gas and solid state lasers particularly by small dimensions, high efficiency for the light generation, ability to be directly modulated up to high frequencies and low power consumptions. However, the use of such laser diodes for the field-assisted photoelectron emission is only meeningful if the coating material has an electron work function of less than 4 eV, as is the case with metal carbides.

In a further embodiment of the invention means are provided for generating circularly polarised light on the end of the optical waveguide which is provided with the coating. With this, polarised electrons are generated, with which domain structures can be imaged on ferromagnetic surfaces.

Further embodiments of the invention are the subject matter of the subordinate claims and are explained in more detail below with reference to the description and the drawings, in which:

Figure 1:
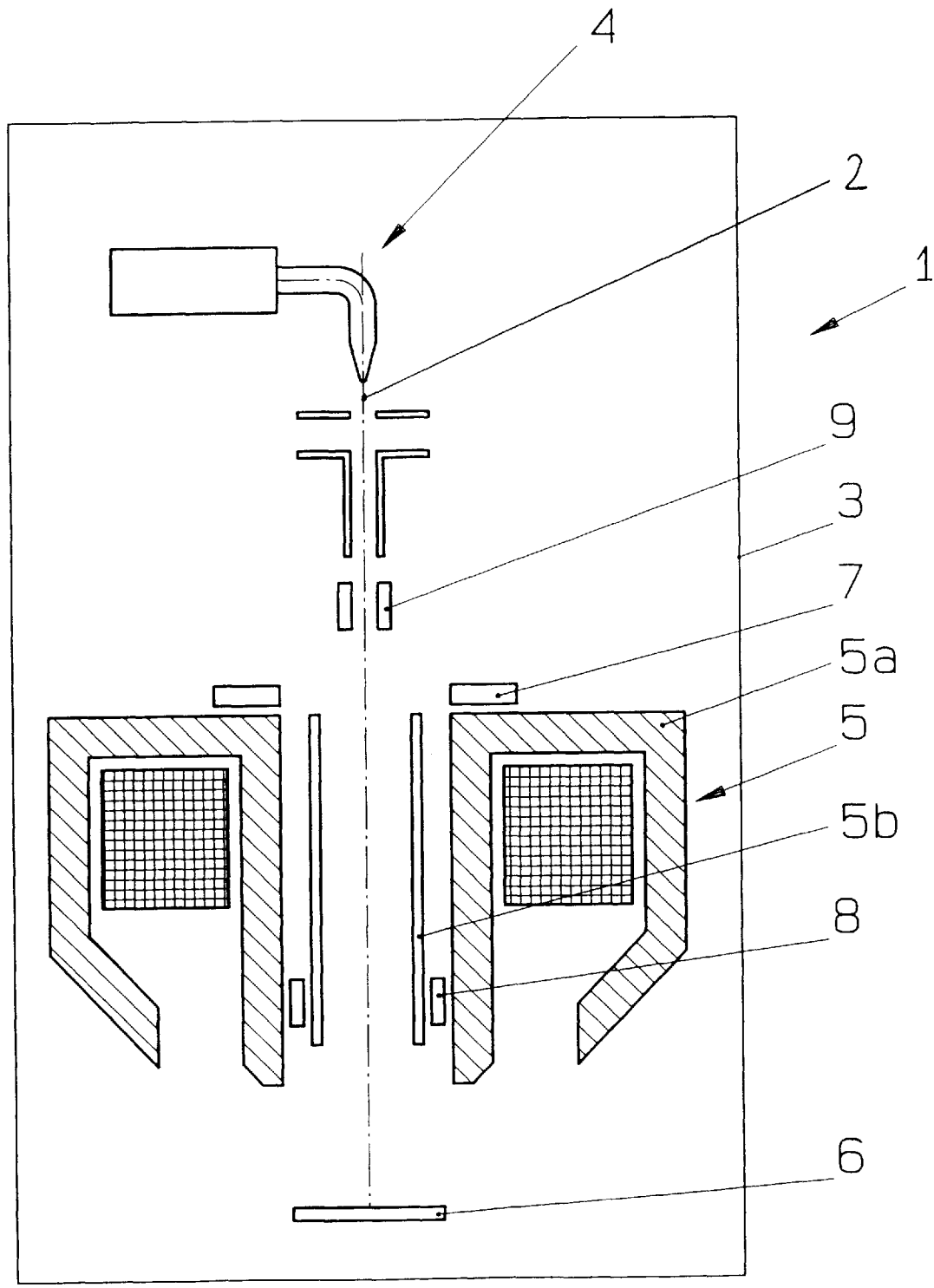
FIG. 1 shows a schematic representation of an electron beam device according to the invention.

FIG. 1 shows an electron beam device 1 with which a focused electron beam 2 can be generated in an optical column 3. This column 4 essentially has, in addition to a large number of magnetic and/or electric lenses and apertures (which are not shown here) for beam shaping, an apparatus 4 for generating the electron beam 2, an objective lens 5 for focusing the electron beam onto a specimen 6 and a detector 7 for detecting the secondary or backscattered electrons released on the specimen.

Within the objective lens 5 a deflecting system 8 is provided in order to deflect the electron beam 2, as is necessary for example during scanning of the specimen 6. The objective lens itself is constructed as an electromagnetic lens with a magnetic lens 5a and an electrostatic lens 5b.

Figure 2:
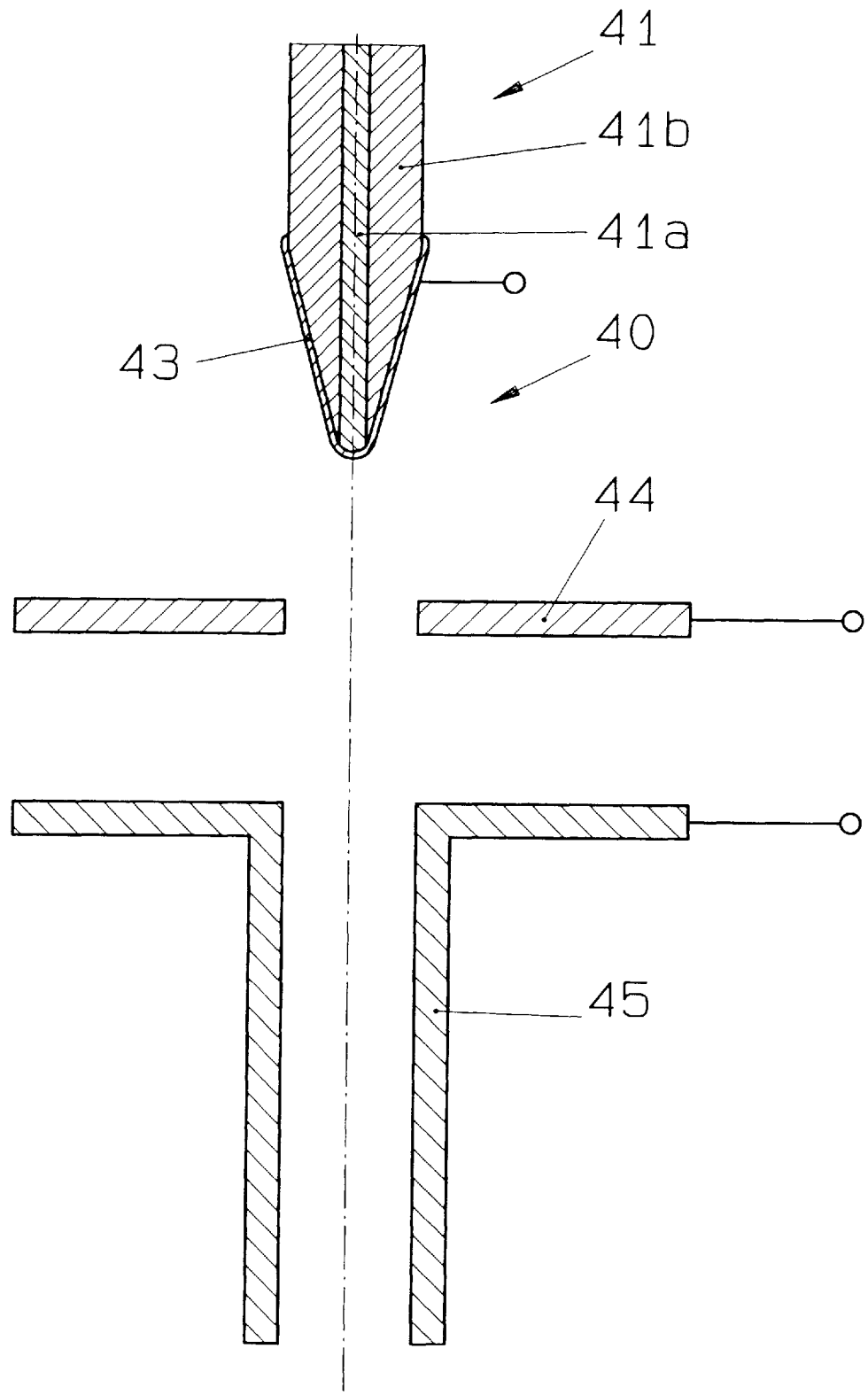
FIG. 2 shows a partial sectional view of the apparatus according to the invention for generating an electron beam.
Figure 3:
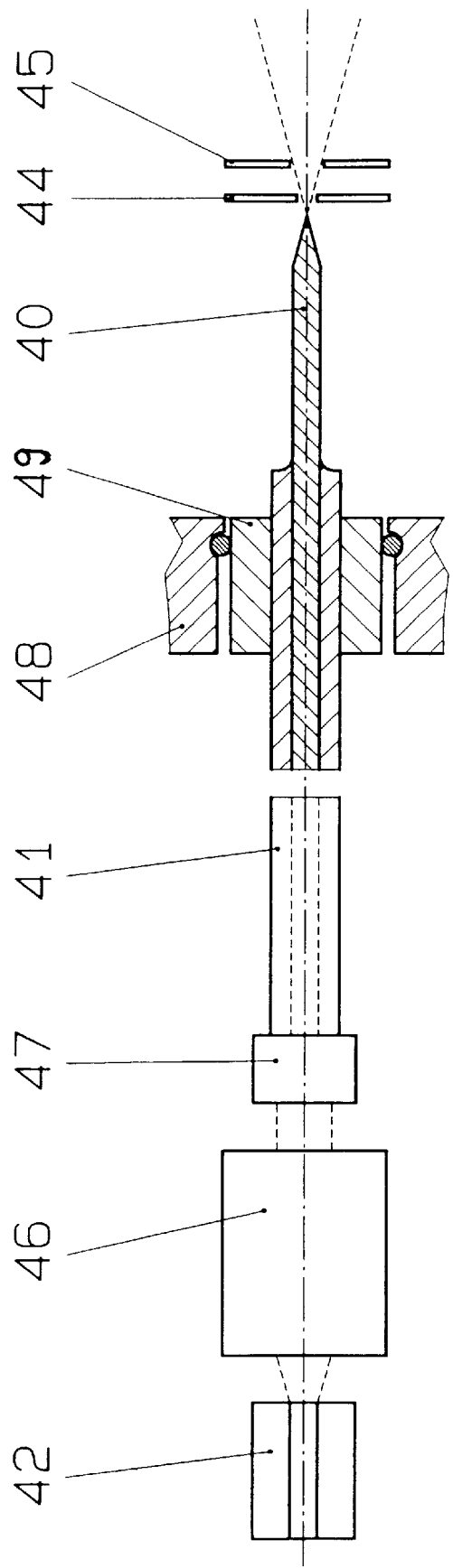
FIG. 3 shows a schematic overall view of the apparatus for generating an electron beam and FIG. 4 shows a schematic view of the means for generating circularly polarised light.

The construction and the operation of the apparatus 4 for generating the electron beam are explained in more detail below with reference to FIGS. 2 and 3. The apparatus 4 is formed by a field-assisted photocathode 40. One end of an optical waveguide 41 is shaped as a tip, provided in the region of its tip with a coating 43, and is used as the emitter. The radius of this tip is advantageously between 0.05 and 1.0 μm.

A light source 42 is coupled on the other end of the optical waveguide 41 in a suitable manner. The optical waveguide 41 is for example formed by a glass fibre with a core 41a and a cladding 41b.

According to the invention a metal carbide, such as for example CrC or TiC, is used for the coating 43. The electron work functions of such metal carbide layers are less than 4 eV and thus are substantially lower than the work functions of the materials such as gold or tungsten which are usually used.

In addition to a low work function, the coating is also required to have a sufficiently high conductivity and adequate transparency. Furthermore, it must adhere firmly to the optical waveguide and have a high mechanical hardness.

In order to be able to generate photemission by visible light, a high extraction field is necessary in the region of the cathode tip. The field-generating means are formed for example by an extraction electrode 44 which is positively charged with respect to the cathode 40. As a result the work function is locally lowered in the region of the cathode tip so far that the visible light fed in from the light source 42 generates a photoemission current.

In the beam path after the extraction electrode 44 there is also provided an anode 45 which, depending upon the application, is kept at a higher or lower potential than that of the extraction electrode 44. In one case the released electrons are further decelerated.

The light source 42 feeds light with a wavelength of 200 to 800 nm into the optical waveguide 41. So-called laser diodes can be used particularly advantageously as light sources 42 within the scope of the invention for this wavelength range. Laser diodes are distinguished over conventional gas and solid state lasers particularly by small dimensions, high efficiency for the light generation, ability to be directly modulated up to high frequencies and low power consumption.

The light generated by the light source 42 is fed into the optical waveguide 41 by means of an optical adapter 46 and a lens 47, for example a "GRIN lens".

Whilst the actual cathode 40 is arranged inside a vacuum chamber 48, the light can easily be fed outside this vacuum chamber into the optical waveguide 41. Thus the optical waveguide 41 must merely be introduced into the vacuum chamber 48 by way of a suitable sealing sleeve 49.

If the small surface of the cathode tip is continuously illuminated, the laser power which can be applied is limited to a few mW because of the heating of the tip. However, since laser diodes are particularly suitable for generating short light pulses, increased illumination intensities can be used in such short pulses. Thus for example light pulses with high intensity can be generated in the picosecond range. These light pulses are generated with a pulsing arrangement which is not shown in greater detail. This pulsing arrangement is coupled to a blanking system 9 (FIG. 1) in order to achieve blanking of the electrons merely released by field emission, which causes a background current.

Figure 4:
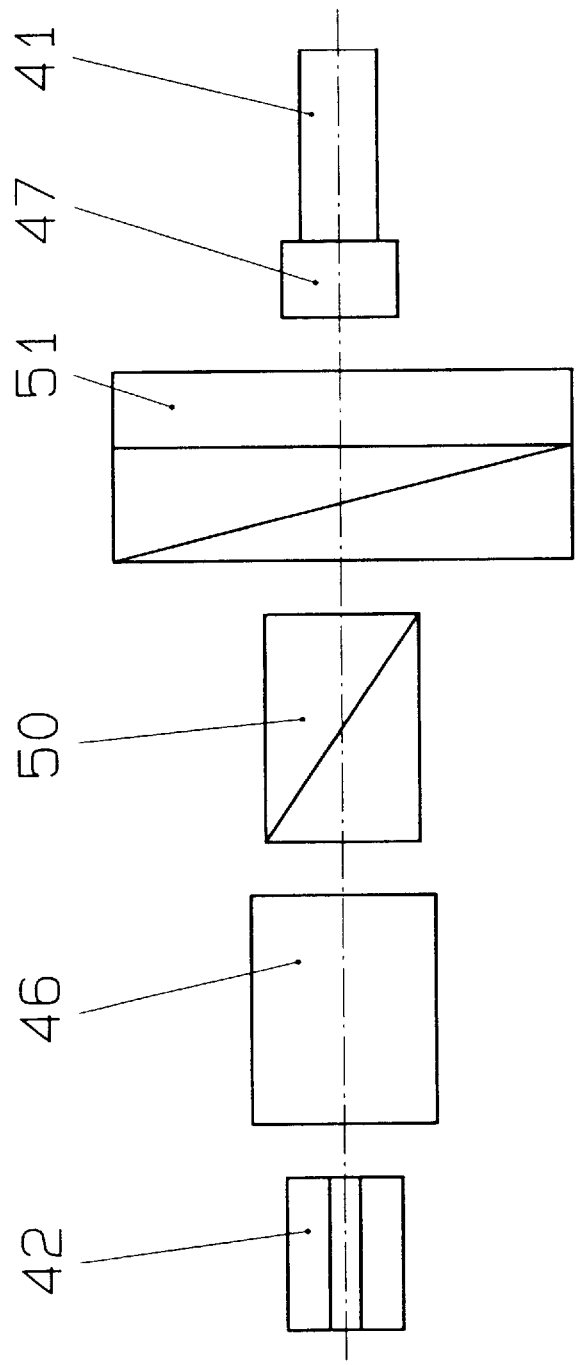

A further possibility for the field-assisted photoemission source is the generation of polarised electrons. For this the cathode tip must be illuminated with circularly polarised light. The embodiment illustrated in FIG. 4 shows means for generating circularly polarised light. They consist essentially of a polariser 50, which linearly polarises the light generated by the laser diode 42. In the subsequent arrangement 51 the incident linearly polarised light is divided into two linearly polarised components which are perpendicular to one another and displaced by $\lambda/4$. Such an arrangement 51 can be formed for example by a so-called Soleil compensator. With equal amplitude circularly polarised light is produced.

It must be noted, however, that within the optical waveguide the phase shift between two linearly polarised waves can change. A suitable counter-compensation is therefore necessary in order to ensure that the light on the cathode tip is circularly polarised.

The polarised electrons which can be generated with circularly polarised light can be used particularly advantageously with electron beam devices in order to image domain structures on ferromagnetic surfaces.

We claim:

1. Apparatus (4) for generating an electron beam (2) with an optical waveguide (41),
   a light source (42) which is coupled on one end of the optical waveguide,
   a coating (43) for generating electrons which is applied to the other end of the optical waveguide, and
   field-generating means in order to lower the electron work function of the coating so far that a photoemission current can be generated,
characterised in that a metal carbide is used as the coating.

2. Apparatus as claimed in claim 1, characterised in that the light source (42) feeds light with a wavelength of 200 to 800 nm into the optical waveguide.

3. Apparatus as claimed in claim 1, characterised in that the light source (42) is formed by a laser diode.

4. Apparatus as claimed in claim 1, characterised in that the light source generates light pulses.

5. Apparatus as claimed in claim 1, characterised in that the metal carbide coating has a work function of <4 eV.

6. Apparatus as claimed in claim 1, characterised in that the end of the optical waveguide (41) provided with the coating (43) is constructed as a tip.

7. Apparatus as claimed in claim 1, characterised in that the radius of the tip is between 0.05 and 1.0 $\mu$m.

8. Apparatus as claimed in claim 1, characterised in that the field-generating means have an extraction electrode (44), an extraction field being provided between the end having the coating (43) and the extraction electrode.

9. Apparatus as claimed in claim 1, characterised by means for generating circularly polarised light.

10. Apparatus as claimed in claim 9, characterised in that the means for generating circularly polarised light have a polariser (50) for generating linearly polarised light and an arrangement (51) which divides the linearly polarised light from the polariser into two linearly polarised components which are perpendicular to one another and are diplaced by $\lambda/4$.

11. Electron beam device comprising
   a) apparatus (4) for generating an electron beam with an optical waveguide (41),
      a light source (42) which is coupled on one end of the optical waveguide,
      a coating (43) for generating electrons which is applied to the other end of the optical waveguide, and
      field generated means in order to lower the electron work function of the coating so far that a photoemission current can be generated,
   b) an objective lens (5) for focusing the electron beam (2) onto a specimen (6) and
   c) a detector (7) for detecting secondary or backscattered electrons released from the specimen,
characterised in that a metal carbide is used as the coating.

12. Electron beam device as claimed in claim 11, characterised in that a blanking system (9) is provided.

* * * * *